United States Patent
Barnett et al.

(10) Patent No.: US 7,032,064 B2
(45) Date of Patent: Apr. 18, 2006

(54) SINGLE CHIP EMBEDDED MICROCONTROLLER HAVING MULTIPLE NON-VOLATILE ERASABLE PROMS SHARING A SINGLE HIGH VOLTAGE GENERATOR

(75) Inventors: Philip C. Barnett, Oxon (GB); David Sowards, Fremont, CA (US)

(73) Assignee: Emosyn America, Inc., Sunnyvale, CA (US)

( * ) Notice: Subject to any disclaimer, the term of this patent is extended or adjusted under 35 U.S.C. 154(b) by 517 days.

(21) Appl. No.: 10/376,682

(22) Filed: Feb. 28, 2003

(65) Prior Publication Data
US 2003/0145154 A1  Jul. 31, 2003

Related U.S. Application Data

(63) Continuation of application No. 09/394,757, filed on Sep. 13, 1999, now abandoned.

(51) Int. Cl.
*G06F 12/00* (2006.01)
(52) U.S. Cl. .............. 711/103; 365/185.29; 365/185.33
(58) Field of Classification Search ................ 711/103; 365/185.29, 185.33
See application file for complete search history.

(56) References Cited

U.S. PATENT DOCUMENTS

| | | | |
|---|---|---|---|
| 4,141,068 A | * | 2/1979 | Mager et al. ............... 711/103 |
| 5,469,399 A | | 11/1995 | Sato et al. |
| 5,504,707 A | * | 4/1996 | Koizumi ................ 365/185.04 |
| 5,742,787 A | * | 4/1998 | Talreja ........................ 711/103 |
| 5,754,567 A | * | 5/1998 | Norman ...................... 714/773 |
| 5,767,729 A | | 6/1998 | Song |
| 5,852,290 A | | 12/1998 | Chaney |
| 5,861,772 A | | 1/1999 | Lee |
| 5,873,112 A | * | 2/1999 | Norman ...................... 711/103 |
| 5,933,847 A | * | 8/1999 | Ogawa ........................ 711/103 |

\* cited by examiner

*Primary Examiner*—Matthew D. Anderson
(74) *Attorney, Agent, or Firm*—DLA Piper Rudnick Gray Cary US LLP

(57) ABSTRACT

A single chip embedded microcontroller has a processor that communicates with multiple non-volatile erasable PROMS which may be an OTPROM and an EEPROM. The processor also communicates with a high voltage generator that produces the erase and write voltages for the OTPROM and EEPROM. A switch communicates with the high voltage generator and switches the erase and write voltages alternately between the OTPROM and EEPROM. The OTPROM and EEPROM are FLASH arrays. The FLASH array technology allows the EEPROM and OTPROM to have similar erase and write voltages and therefore to share one high voltage generator. The high voltage generator is switched alternately between the first and second non-volatile erasable PROM arrays to enforce the principle that the EEPROM and OTPROM cannot be written to or erased at the same and may only be written to or erased one at a time.

13 Claims, 7 Drawing Sheets

US 7,032,064 B2

SINGLE CHIP EMBEDDED MICROCONTROLLER HAVING MULTIPLE NON-VOLATILE ERASABLE PROMS SHARING A SINGLE HIGH VOLTAGE GENERATOR

CROSS REFERENCE TO RELATED APPLICATIONS

This application is a continuation of U.S. application Ser. No. 09/394,757, filed Sep. 13, 1999 now abandoned.

BACKGROUND OF THE INVENTION

1. Field of the Invention

The invention relates to a single chip embedded microcontroller (smart card integrated circuit) using FLASH array technology to create multiple non-volatile erasable PROMS which share a single high voltage generator. More particularly, the FLASH array technology allows an EEPROM and OTPROM to have similar erase and write voltages and therefore to share the high voltage generator.

2. Description of the Related Art

Smartcard devices are single chip systems that are self contained and need only an energy supply and a serial interface to function. The supply is either obtained by contacts from the reader, or by an electromagnetic field. In both cases the voltage that the device uses is low, for example 3v. or 5v., to minimize the power consumed. However, non-volatile memory technologies on the smart card require voltages 2 to 3 times that of the other circuit elements. This has to be supplied to allow the erasing and writing of these non-volatile memories. The specification for ISO compatible contacting devices does specify a pin to supply the voltage for the non-volatile memory, but this is no longer used on the grounds of security. Smart card devices have on board voltage converter circuitry, to produce the high voltage required by the non-volatile memory. These are large and electrically noisy and add to the cost of the device. If both non-volatile EEPROM (electrically erasable programmable read only memory) and OTPROM (one time programmable read only memory) memories are used on the smart card then multiple voltage supplies and decode logic are needed to support the memories. The reason is that different technologies may be used to create the EEPROM and OTPROM arrays and hence different erase and write voltages are needed.

It would be desirable to have a smart card with multiple non-volatile erasable PROM arrays that operate independently and still share one high voltage power supply to provide the high voltage required for erasing and writing.

SUMMARY OF THE INVENTION

A single chip embedded microcontroller has a processor communicating with first and second non-volatile erasable PROM arrays. The processor reads, erases and writes information to and from the non-volatile erasable PROM arrays. A high voltage generator provides the erase and write voltages for the first and second non-volatile erasable PROM arrays and also communicates with the processor. A switch communicating with the high voltage generator, switches the erase and write voltages alternately between the first and second non-volatile erasable PROM arrays. The first and second non-volatile erasable PROM arrays are FLASH arrays and may be an OTPROM and EEPROM, respectively.

The FLASH array technology allows the EEPROM and OTPROM to have similar erase and write voltages and therefore to share one high voltage generator. The high voltage generator is switched alternately between the EEPROM and OTPROM arrays to enforce the principle that the EEPROM and OTPROM may be written to or erased one at a time (i.e. not simultaneously).

Sharing one high voltage generator reduces significantly the area of the die hence its cost, and also allows flexibility in the layout. Also because EEPROM and OTPROM use common technologies the memory voltage requirements are very well matched and the high voltage generator design is simplified.

Another advantage of using FLASH array technology for both EEPROM and OTPROM is that two totally independent arrays may be fabricated on one piece of silicon. This allows the independent arrays to have unique cell array structures that perform different functions, for example, reading and writing different size blocks of memory.

DETAILED DESCRIPTION OF THE INVENTION

Figure 1:
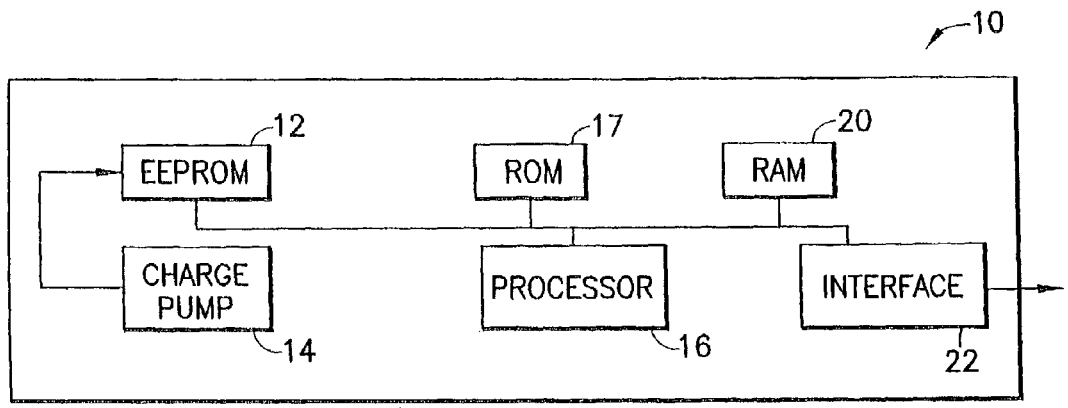
FIG. 1 is a block diagram of a prior art smart card having an EEPROM.

FIG. 1 shows a prior art single chip smart card 10 having an EEPROM memory 12. The EEPROM has an internal charge pump power supply 14 which provides a high voltage from 12–15 v for erasing from and writing to the EEPROM. The remainder of the circuitry on the smart card IC includes a processor 16, for example an 8051 microprocessor, standard ROM (read only memory) 18, standard RAM 20, and an interface 22 for interfacing the circuitry of the smart card 10 to external power and data input sources. The external power source is 3.0 v or 5v which is the supply voltage used to operate the smart card 10. The EEPROM needs only 3 v. for its read voltage. However, a write (i.e. programming) or erase operation, needs charge pump 14 to generate 12 or 15 v., respectively, to be applied to EEPROM 12.

Figure 2:
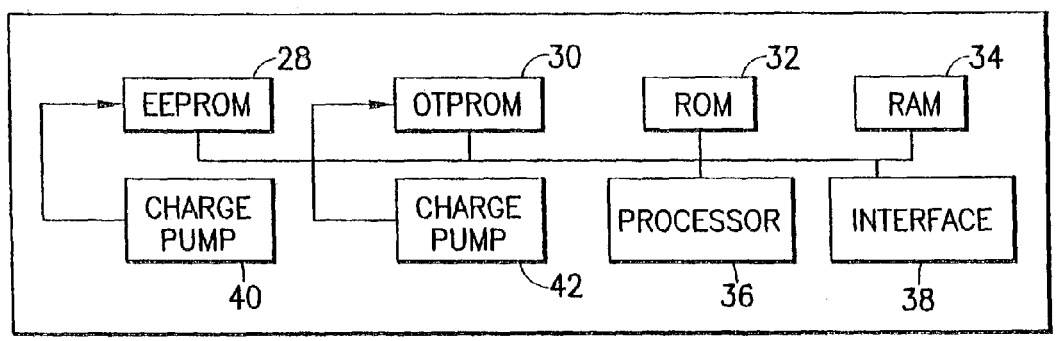
FIG. 2 is a block diagram of a prior art smart card having both an EEPROM and an OTPROM.

FIG. 2 shows a more sophisticated prior art smart card 26 having both EEPROM 28 and OTPROM 30. The OTPROM 30 will contain an operating system to run the functions and applications of smart card 26. EEPROM 28 will contain for example data, applications programs, pictures, extensions to the operating system, or other data or programs necessary for operation of the smart card. ROM 32, RAM 34, processor 36, and interface 38 are the same as the corresponding elements shown in FIG. 1. Both EEPROM 28 and OTPROM 30 have separate charge pumps 40 and 42 to provide the voltages necessary (e.g. 12 v. or 15 v.) for erasing or writing. Charge pump 40 is designed to provide the voltages necessary to erase and write to EEPROM array 28. Likewise, charge pump 42 is designed to provide the voltages necessary to erase and write to OTPROM array 30. Different technologies are used to create the EEPROM and OTPROM arrays and hence the need for different erase and write voltages. Charge pumps 40, 42 are electrically noisy and large thus taking up a large amount of space on the integrated circuit which adds to the cost of the device.

Figure 3:
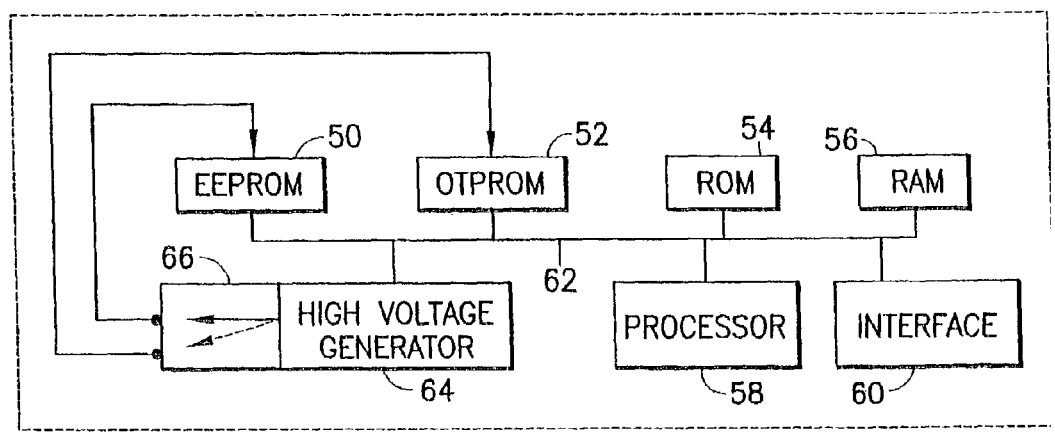
FIG. 3 is a block diagram of the smart card of the invention having an EEPROM and an OTPROM with a shared single high voltage generator to provide erase and write voltages.

FIG. 3 shows smart card 48 according to the present invention which has multiple non-volatile erasable PROMS and overcomes the problem of needing two high voltage charge pumps. The non-volatile erasable PROMS of smart card 48 are EEPROM array 50 and an independent OTPROM array 52. They are both on one piece of silicon and share a single high voltage generator 64. This is made possible because they use the same FLASH technology which allows similar erase and write voltages to be used for both arrays. This is in contrast to U.S. Pat. No. 5,504,707 (Koizumi) which has an OTPROM and EEPROM located on the same array and use one high voltage power supply. Since the present invention has separate arrays, they can be addressed separately and simultaneously. For example, the OTPROM can be read and the EEPROM written to simultaneously.

FLASH is an industry term that includes many different types of technologies. The common link in general terms is that they generally use a single transistor per storage bit. Also, they use a block or full array erase method, which allows that block or array to erase instantaneously. This particular implementation is for use in smartcards, however other applications using a microcontroller with embedded memory could use this technique.

Looking more closely at FIG. 3, OTPROM 52 contains an operating system to run the functions and applications of smart card 48. EEPROM 50 will contain for example data, applications programs, pictures, extensions to the operating system, or other data or programs necessary for operation of the smart card 48. ROM 54, RAM 56, processor 58, and interface 60 are the same as the corresponding elements shown in FIG. 2. Processor 58 is connected by a bus 62 (i.e. communication link) to OTPROM 52, EEPROM 50, ROM 54, RAM 56, and interface 60. Processor 58 coordinates all communications to OTPROM 52, EEPROM 50, ROM 54, and RAM 56 and interface 60. These communications are generated by the processor 58 and may be a result of information received through the interface 60.

Processor 58 is also indirectly connected by bus 62 to high voltage generator 64, via the memory control logic. The high voltage generator 64 provides the high voltages, for example 12 v and 15 v, necessary to erase and write to EEPROM array 50 and OTPROM array 52. Because the OTPROM 52 and EEPROM 50 use the same basic FLASH cell technology it is possible to design a high voltage generation circuit (charge pump) that may be used by both. This reduces significantly the area of the die used by the charge pump, hence reducing its cost and allowing flexibility in the layout. Also, because EEPROM 50 and OTPROM 52 use common technologies, the memory voltage requirements are very well matched and the high voltage generator 64 design is simplified.

The high voltage is provided to EEPROM 50 and OTPROM 52 through a switch 66 included as part of high voltage generator 64. The EEPROM 50 and OTPROM 52 are separate arrays on the chip and the erasing and writing to both EEPROM and OTPROM are made exclusive, within this architecture. High voltage generator 64 can be applied to either EEPROM 50 or OTPROM 52 one at a time but not both at the same time. However, it is certainly possible to design an architecture where both could be written at the same time if that was desirable in that system. This can be done by synchronizing the write or erase of both memories and using a single HV pulse, because both memories are using the same underlying technology. The EEPROM can be written to and the OTPROM read from simultaneously and vice versa. However, the EEPROM and OTPROM cannot be erased or written to simultaneously.

The operating system in the OTPROM determines whether the charge pump is connected to EEPROM 50 or OTPROM 52. This is as a result of the processor initiating an erase or write sequence in either the EEPROM or the OTPROM array.

This shared service of the high voltage generator 64 can be used because of the common FLASH technology for the OTPROM and EEPROM and enforcing the principle that the OTPROM and EEPROM will not be exercised at the same time. This principle is enforced by a straightforward regime. The OTPROM and EEPROM memory blocks are self contained units responsible for the sequencing and control of the data memory cells that ensure the correct sequence is followed to read, erase and write to the cells. This includes the sequencing of the charge pump, high voltage generator 64.

When the integrated circuit (IC) for smart card 48 is manufactured a program is entered into ROM 54 which is used for loading the OPTROM. The IC then goes to the smart card manufacturer who incorporates the IC into the smart card 48 and uses ROM 54 to load an operating system into OPTROM 52. Once OPTROM 52 is loaded it will load data and programs into EEPROM 50. It will also control and direct high voltage generator 64 to connect to EEPROM 50 thus allowing the EEPROM to be erased and written to. This is the mode that the smart card will stay in most of the time. The operating system in OPTROM 52 will control the operation of the applications, data and programs in EEPROM 50 to perform the functions of the smart card.

On limited occasions it will be necessary or desirable to change the operating system in the OTPROM 52. To accomplish this a write or erase sequence is initiated to the OTPROM, which has the effect of turning on the charge pump and switching it through to the OTP array. This allows OTPROM 52 to be erased from or written to. An example would be if the function of the card were to change from a security card to a money card which needed the security function and additional money handling functions. In the field, an operator would enter commands from an external processor through interface 60 to processor 58 to connect the high voltage generator 64 to OTPROM 52 and to enter programs and program data into the OTPROM that accomplish the money functions.

Figure 4:
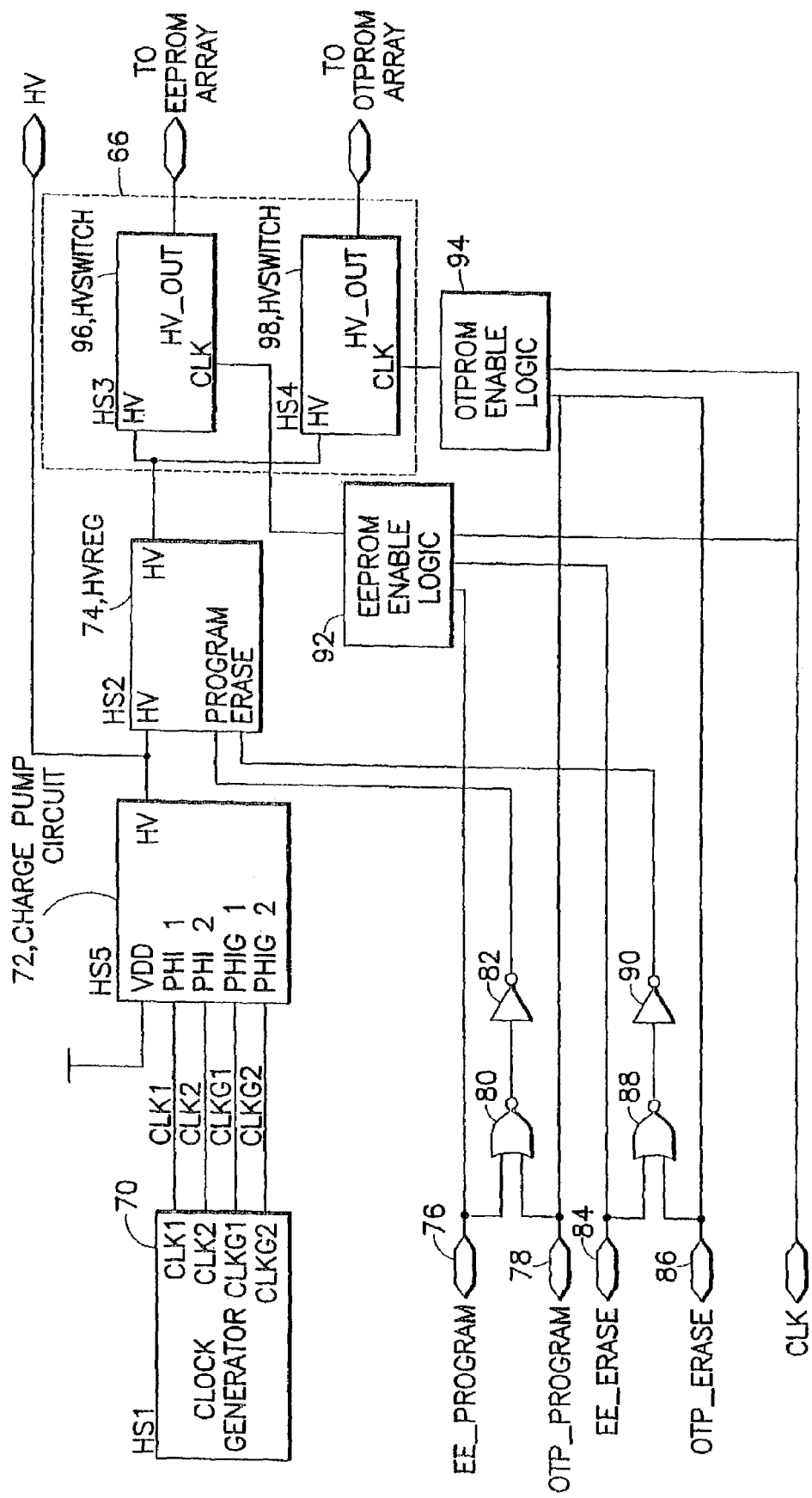
FIG. 4 is a block diagram of the high voltage generator of FIG. 3.

FIG. 4 is a block diagram of high voltage generator 64 (shown in FIG. 3). A clock generator 70 provides clock signals clk1, clk2, clkg1, and clkg2 to a capacitive charge pump circuit 72. The clock signals provide the timing signals necessary for the charging of the capacitors in the charge pump and its operation. The output of charge pump 72 is an unregulated voltage having an amplitude of about 19 v. This voltage is provided to a high voltage regulator 74

(hvreg) which provides regulated voltages of 12 v. and 15 v. necessary for erasing and writing to EEPROM 50 and OTPROM 52 (shown in FIG. 3). Signals EE PROGRAM 76 and OTP PROGRAM 78 from processor 58 (shown in FIG. 3) help activate high voltage regulator 74 to provide the correct write voltage for EEPROM 50 and OTPROM 52 respectively. EE PROGRAM 76 and OTP PROGRAM 78 both provide a signal to NOR gate 80 and inverter 82. NOR gate 80 and inverter 82 provide an initializing signal to high voltage regulator 74 to produce the write voltage if either EE PROGRAM 76 and OTP PROGRAM 78 is present. Similarly, signals EE ERASE 84 and OTP ERASE 86 from processor 58 help activate high voltage regulator 74 to provide the correct erase voltage for EEPROM 50 and OTPROM 52, respectively. Nor gate 88 and inverter 90 allow either EE ERASE 84 and OTP ERASE 86 to initiate the erase signal.

At the same time that one of the signals EE PROGRAM 76, OTP PROGRAM 78, EE ERASE 84 or OTP ERASE 86 is initiating the write or erase high voltage, the signal is also activating either EEPROM Enable Logic 92 or OTPROM Enable Logic 94 to activate EEPROM array 50 or OTPROM array 52, respectively. OTP PROGRAM 78 and OTP ERASE 76 are both fed to OTPROM Enable Logic 94. Either signal may initiate the enablement of OTPROM array 52. Similarly, EE PROGRAM 76 and EE ERASE 74 are both fed to EEPROM Enable Logic 92. Either signal may initiate the enablement of EEPROM array 50.

If EE PROGRAM 76 signal is provided to high voltage regulator 74, a write high voltage of 15 v. is provided to a pair of high voltage switches 96 and 98 in switch 66 (shown in FIG. 3). EE PROGRAM 76 also enables EEPROM Enable Logic 92 which provides a clock signal to high voltage switch 96 which clocks the 15 v. write high voltage to EEPROM array 50. Similarly the other signals EE ERASE 84, OTP PROGRAM 78 and OTP ERASE 86 cause either the write or erase voltage to be applied to EEPROM array 50 or OTPROM array 52.

Another advantage of using FLASH arrays for both EEPROM and OTPROM is that two totally independent arrays may be fabricated on one piece of silicon using the same non volatile memory cell. This allows the independent arrays to have unique array architectures that perform different functions. For example, the array structures for the OTPROM and EEPROM may be different and write to different size blocks of memory depending on the function to be performed. FLASH memory requires that memory be erased in block segments of multiple bytes and not cell by cell.

Generally, FLASH memory is an alternative to EEPROMs on a smart card and solves part of the problem of large EEPROM cell size. FLASH memory is fabricated using similar technology to the EEPROM but does not need a byte select transistor or a tunneling window and are hence much smaller. The term "FLASH" comes from the ability to simultaneously electrically erase an entire memory array or a large portion of the memory array.

FLASH memory is a growing class of non-volatile storage integrated circuits which have the capability of electrically erasing, programming, and reading a memory cell in the chip. The memory cell in a FLASH array is formed using so-called floating gate transistors, in which the data is stored in a cell by charging or discharging the floating gate. The floating gate is a conductive material, typically made of polysilicon, which is insulated from the channel of the transistor by a thin layer of oxide, or other insulating material, and insulated from the control gate or word line of the transistor by a second layer of insulating material. Data is stored in the memory cell by charging or discharging the floating gate.

A FLASH memory is organized into rows and columns. Memory cells are placed at intersections of word lines and bit lines. Each word line is connected to the gates of a plurality of memory cells in one row. Each bit line is connected to the drains of a plurality of memory cells in any column. The sources of all the memory cells are connected to a common source line. The FLASH memory can be programmed by a user. Once programmed, the entire contents of the FLASH memory can be erased by electrical erasure in one relatively rapid operation. A high erasing voltage is made available to the sources of all the cells in the FLASH memory simultaneously. This results in a full array erasure. The FLASH memory may then be reprogrammed with new information (i.e. data, commands, or signals).

FLASH memory technology that may be used to fulfil the functionality of both the EEPROM 50 and OTPROM 52 arrays is described in the publicly available Silicon Storage Inc. ("SST") Flash Memory 1978 Data Book, pp. 6–42. Relevant portion of the Data Book follows.

The FLASH technology and memory cell have a number of important advantages for designing and manufacturing FLASH EEPROMs or embedding FLASH memory in logic devices, when compared with the thin oxide stacked gate or two transistor approaches. These advantages translate into significant cost and reliability benefits for the user.

The SST FLASH technology typically uses a simpler process with fewer masking layers, compared to other flash EEPROM approaches. The fewer masking steps significantly reduce the cost of manufacturing a wafer. Reliability is improved by reducing the latent defect density, i.e. fewer layers are exposed to possible defect causing mechanisms.

The SST split gate memory cell is comparable in size to the single transistor stacked gate cell (for a given level of technology), yet provides the performance and reliability benefits of the traditional two transistor byte alterable E$^2$PROM cell. By design, the SST split gate memory cell eliminates the stacked gate issue of "overerase' by isolating each memory cell from the bit line. "Erase disturb" cannot occur because all bytes are simultaneously erased in the same page and each page is completely isolated from every other page during any high voltage operation.

The field enhancing tunneling injector EEPROM cell is a single transistor split gate memory cell using poly-to-poly Fowler-Nordheim tunneling for erasing and source side channel hot electron injection for programming. Poly-to-poly tunneling is from a field enhancing tunneling injector formed on the floating gate using industry standard oxidation and dry etching techniques. Source side channel hot electron injection is very efficient, thus allowing the use of a small on-chip charge pump from a single low voltage power supply e.g., 5 or 3 volts. Cells are normally erased prior to programming.

The split gate memory cell size is comparable to traditional stacked gate memory cells using the same process technology. This is possible because;

a) the Tunneling injector cell does not need the extra spacing to isolate the higher voltages and currents required for programming the stacked gate. Array, and b) floating gate extensions are not needed to achieve the required stacked gate coupling ratios.

Additionally, the simplicity of the structure eliminates many of the peripheral logic functions needed to control erasing of the stacked gate device. The tunneling injector cell can be formed using standard CMOS processes.

Memory arrays may use either random access or sequential access peripheral architectures.

Figure 5A:
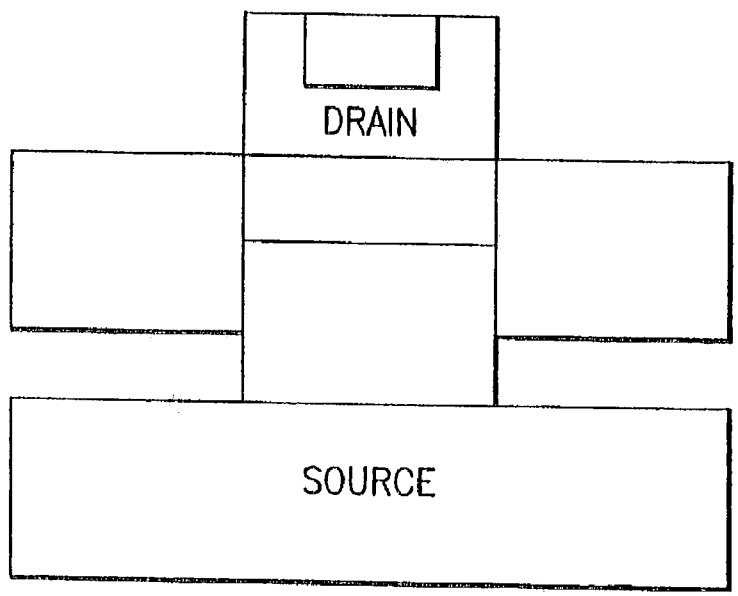
FIG. 5A is a top view of a FLASH cell.
Figure 5B:
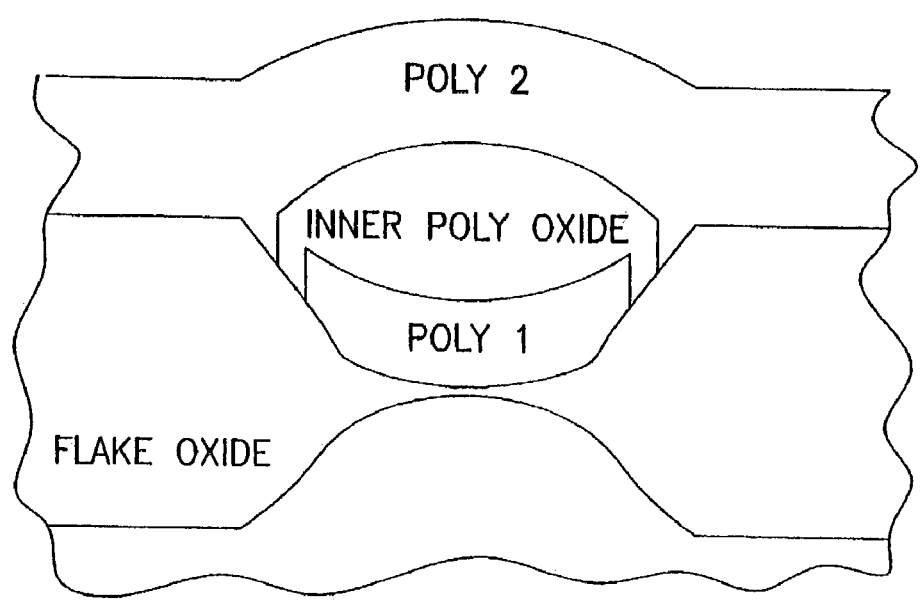
FIG. 5B is a cross-section view of a FLASH cell along a WORD line.

A top view and a cross-sectional view along the word line are presented in FIGS. 5A and 5B (note drawings are not to scale).

Figure 6A:
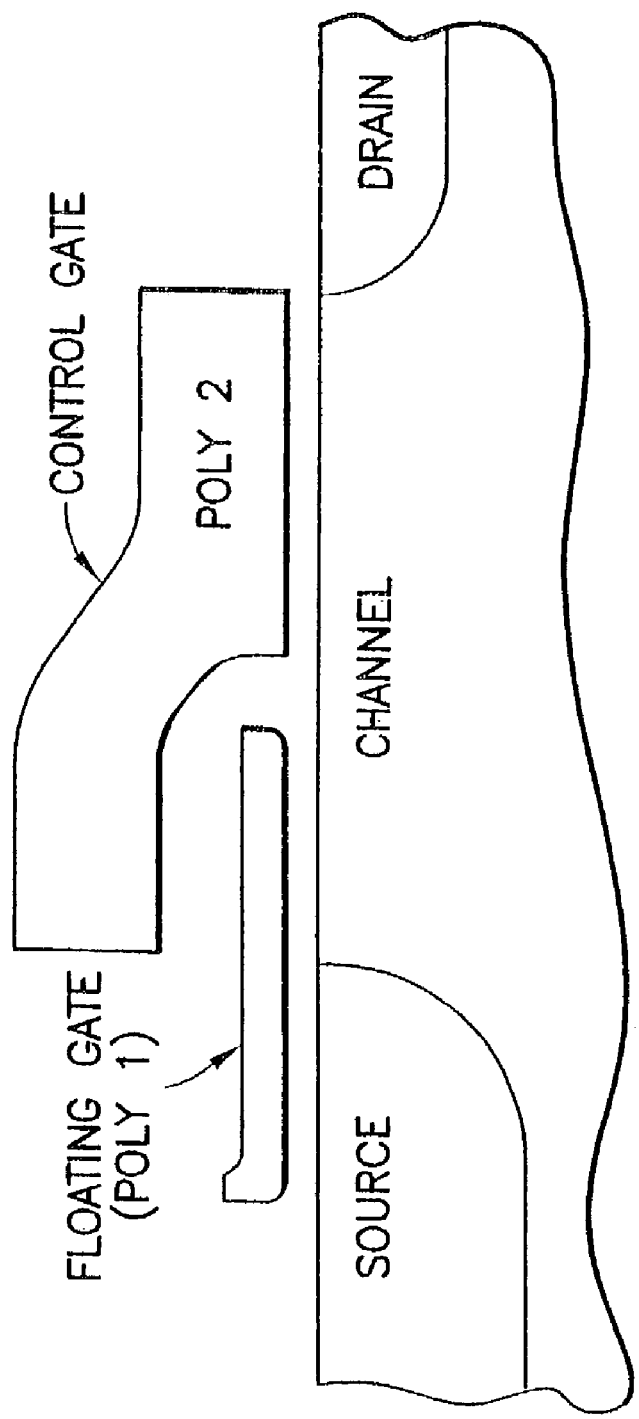
FIG. 6A is a cross-section view of a FLASH cell along a BIT line.
Figure 6B:
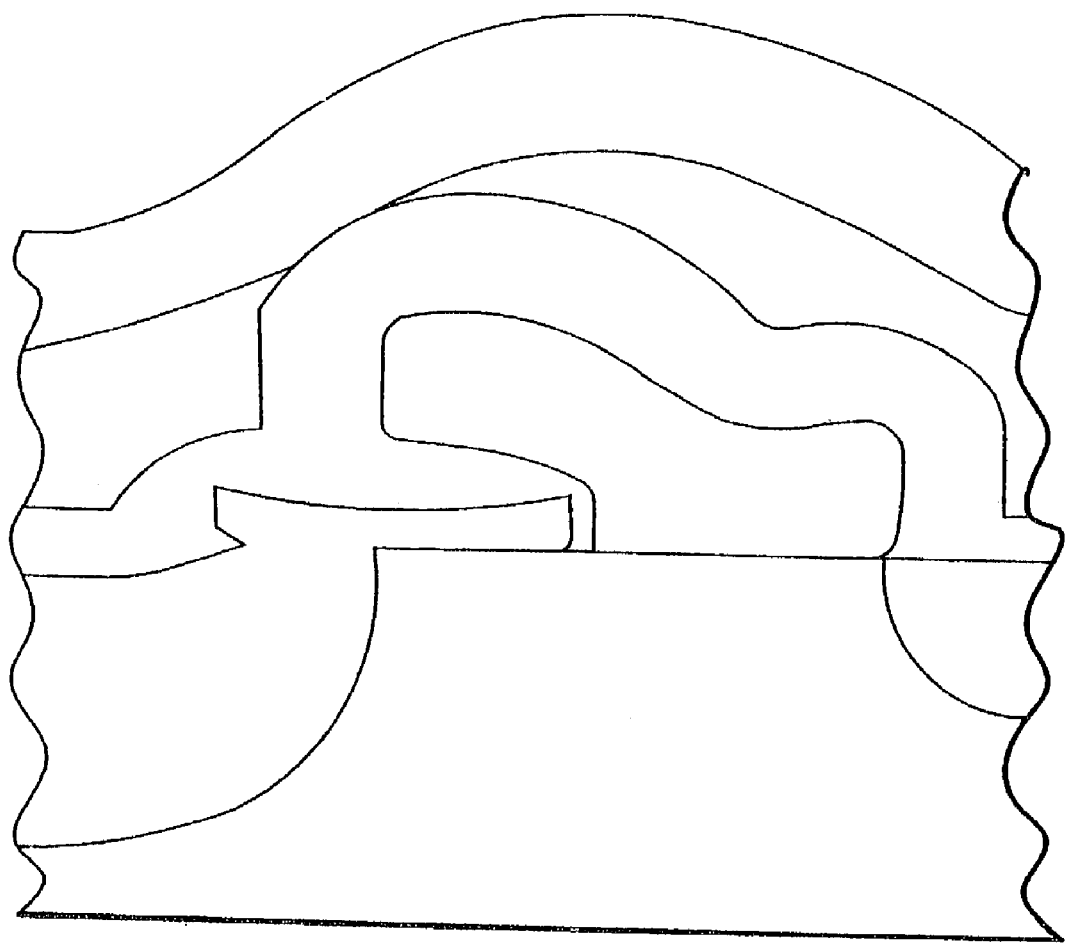
FIG. 6B is a cross-section SEM picture of a FLASH cell.

A cross-sectional view along the bit line and an SEM cross-section are presented in FIGS. 6A and 6B. Polysilicon or polysilicon with silicide is used to connect control gates along the word line (row). Metal is used to connect the drain of each memory cell along the bit line (column). A common source is used for each page, i.e., each pair of bits sharing a common source along a row pair (even plus odd row). A single word line is referred to as a row; the combination of the even and odd rows form a page, which is erased as an entity. Programming may be either byte by byte individually or for all bytes within the same page simultaneously.

The drain region consists of an n+S/D diffusion, which is aligned with the edge at the Poly 2 control gate. The source region consists of an n+S/D diffusion, which overlaps the floating poly. A cell implant beneath the floating gate is used to control the intrinsic cell threshold ($V_T$) and the punch through voltage. The select gate is separated from the channel by a 40 nm oxide (note: all the values are for a generic 1μ technology). The floating gate is separated from the channel and source diffusion by a thermally grown 15 nm gate oxide. The floating gate is separated from the control gate by a 40 nm oxide on the sidewall and a 200 nm oxide vertically between the gates. The tunneling injector on the floating gate is formed by oxidation of the polysilicon, similar to the formation of the field oxide "birds beak" on single crystal silicon, followed by a reactive ion etching of polysilicon. A silicide or polycide can be formed on the control gate to reduce the poly word line resistance.

Figure 7A:
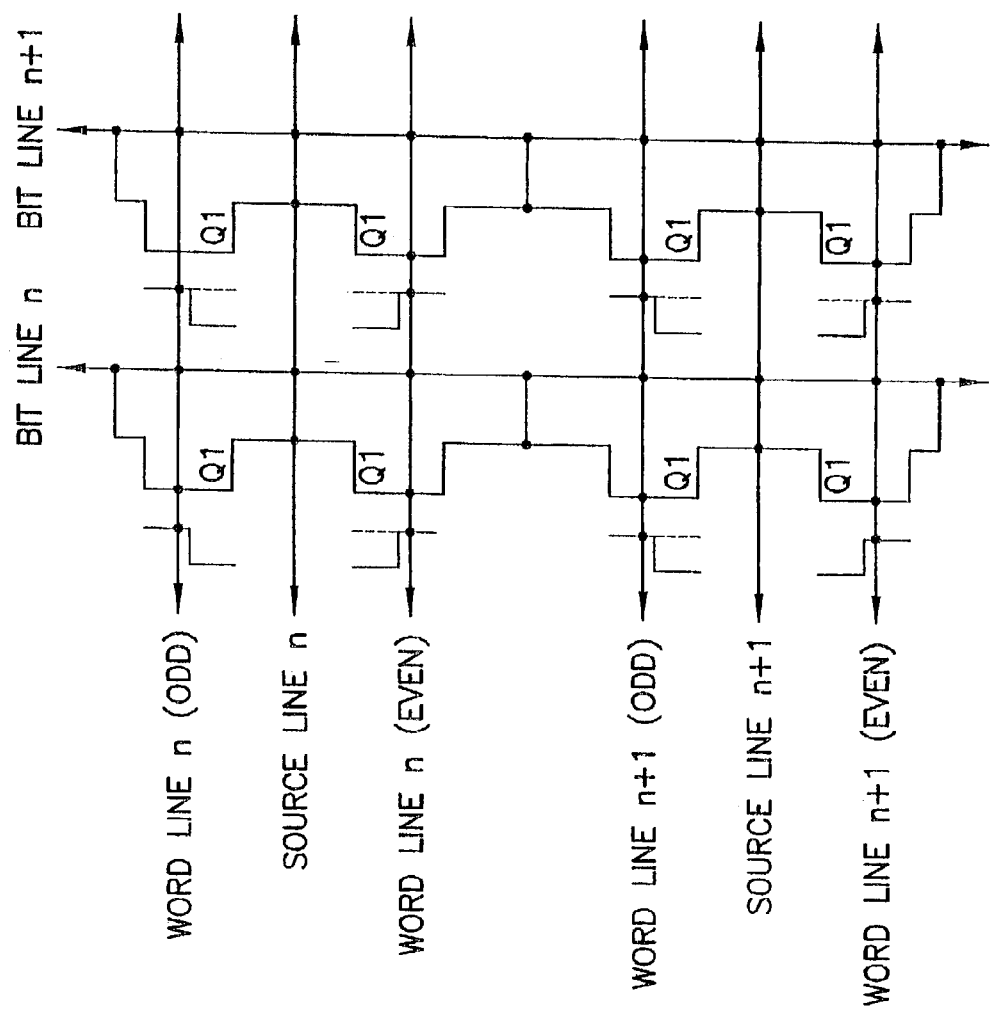
FIG. 7A is a FLASH cell array schematic.
Figure 8:
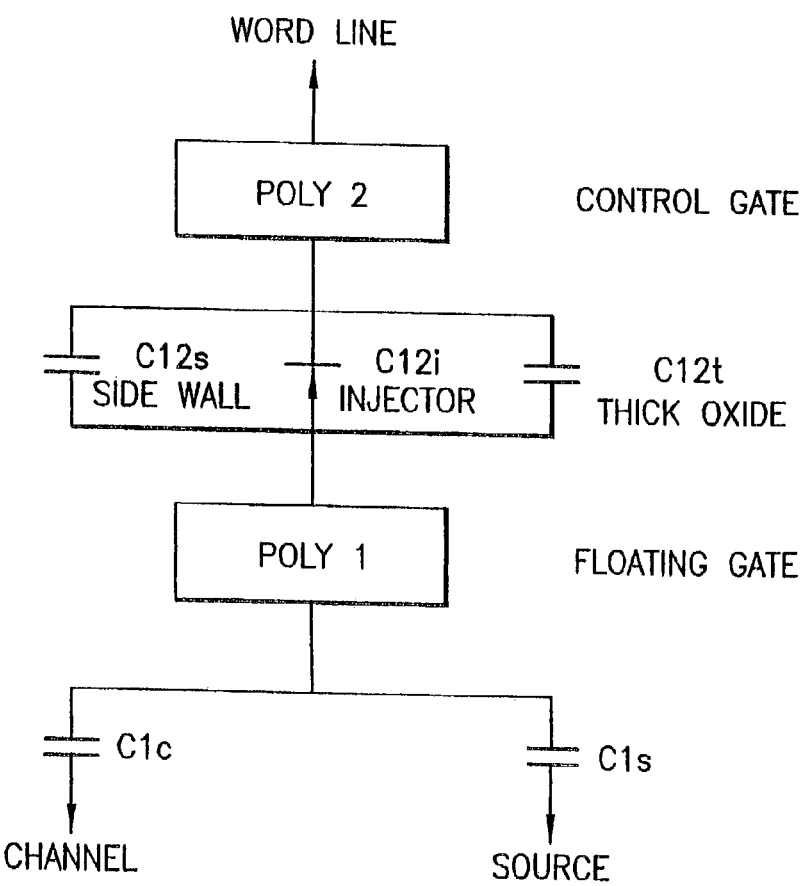
FIG. 8 is an equivalent circuit for capacitive coupling for Q1 of FIG. 7A.

The cell schematic is presented in FIG. 7A, showing the logical organization of the memory array. An equivalent circuit representation used to illustrate capacitive coupling is presented in FIG. 8.

For the split gate memory cell, the channel between the source and drain is split and controlled by the series combination of the select gate transistor and the memory gate transistor. The memory transistor is either in high or low negative threshold state depending on the amount at stored electric charge on the floating gate. See FIG. 7A.

During the read operation, this reference voltage is applied to the control gate and the select gate, via the word line. The reference voltage will "turn on" the select gate portion of the channel. If the floating gate is programmed (high threshold state), the memory transistor portion of the channel will not conduct. If the floating gate is erased (low or negative threshold state), this memory cell will conduct. The conducting state is output as logic "1", the non-conducting state is a logic "0".

Figure 7B:
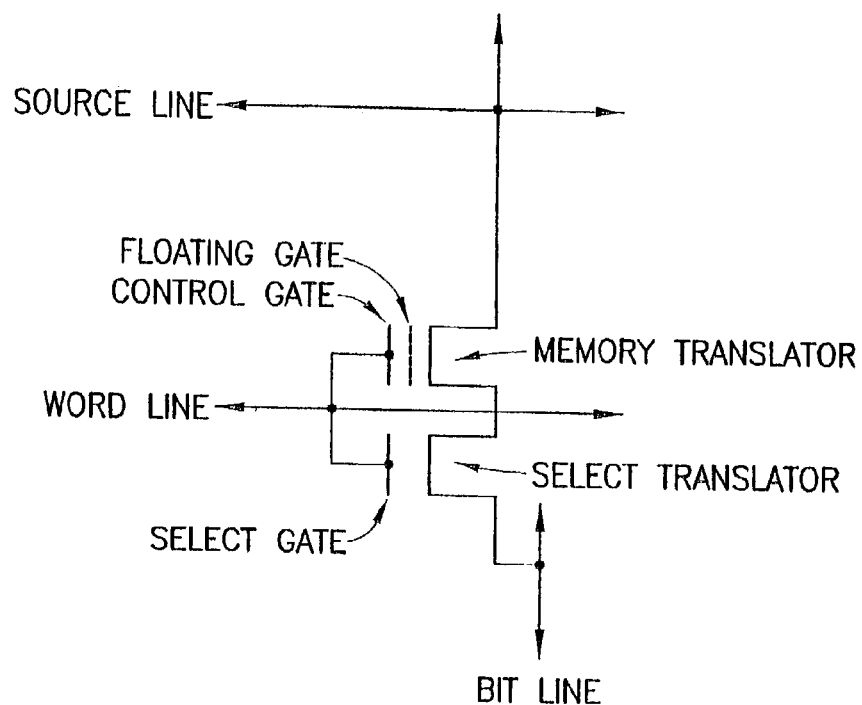
FIG. 7B is an equivalent memory cell structure for Q1 of FIG. 7A

FIG. 7A represents a section of a typical cross-point memory array, arranged as 8 memory cells in 2 columns (bit lines), 2 source lines, and 4 word lines (rows). Note, the word line is split into an even and odd row, which isolates the source line from all other source lines. FIG. 7B is an equivalent memory cell, showing how the split gate cell provides the logical equivalent of a select transistor and a memory transistor. The voltage applied to each terminal during normal operations is listed in Table 1.

$C1O=C1c+C1s; C12=C12s+C12I+C12t$

Coupling Ratios (CR) are defined as:

1. $CR10 = CR(poly\ 1\ to\ substrate) = C10/(C10+C12)$
2. $CR12 = CR(poly\ 1\ to\ poly2) = C12/(C10+C12)$
3. $CR10 + CR12 = 1$ During erasing, the channel is in inversion due to the word line voltage. This increases the value of C1c. During programming the channel is in depletion; thus, C1c is negligible. Therefore, the coupling ratios are different during erasing and programming.

During programming, the coupling capacitance ratio between the source and the floating gate is ≡80%. This means ≡80% of the voltage at the source will be coupled to the floating gate, e.g., if the source is at 12 volts, the floating gate will be at 9.6 volts, given no charge on the floating gate.

The following Table 1 gives the conditions for the memory cell terminals during the erase, program, and read operations. These are nominal conditions for a generic 1μ process. Vdd is the power supply, nominal 3 or 5 volts. Vss is ground. $V_T$ is the cell threshold. $V_{REF}$ is the reference voltage used to access the memory cell during the read cycle. The high voltages on the word line during erase and the source line during programming are generated by an on-chip charge pump.

TABLE 1

| | Operating Conditions | | |
| --- | --- | --- | --- |
| | ERASE | PROGRAM | READ |
| WORD LINE | ≡15 volts | $V_T$ | $V_{REF}$ |
| BIT LINE | Vss | Vdd → "1" =Vss → "0" | ≡2 volts |
| SOURCE LINE | Vss | ≡12 volts | Vss |

The cell erases using floating gate to control gate Fowler-Nordheim enhanced tunneling injector along the edges of the floating gate. This repeatable manufacturing process provides consistent oxide integrity that minimizes endurance induced degradation. i.e., charge trapping or oxide rupture.

During erasing, the source and drain are grounded and the word line is raised to ≡15 volts. The conditions for erasing are in Table 1, reference FIG. 6 for identification of terminals. The low coupling ratio between the control gate and the floating gate provides a significant ΔV across the interpoly oxide, which is the same everywhere between Poly 1 and Poly 2. A local high electric field is generated primarily along the edge of the tunneling injector. Charge transfer is very rapid and is eventually limited by the accumulation of positive charge on the floating gate. This positive charge raises the floating gate voltage until there is insufficient ΔV to sustain Fowler-Nordheim tunneling.

The removal of negative charge leaves a net positive charge on the floating gate. The positive charge on the floating gate decreases the memory cells threshold voltage, such that the memory cell will conduct≡80 μA when the reference voltage is applied to the memory cell during a read cycle. The reference voltage is sufficient to turn on both the select transistor and the erased memory transistor in the addressed memory cell.

Erasing can either be by fixed erase pulses generated by an internal timer or algorithmically generated by an external controller in order to optimize erase performance.

The enhanced field tunneling injector devices are internally organized by pairs (pages) of even and odd rows. Each row pair (page) shares a common source line and each row pair has the word line at me same voltage potential during erasing. Thus, all bytes are simultaneously erased along the common word lines. All other word lines (pages) do not receive the erasing high voltage. Therefore, erase disturb is not possible. The column leakage phenomena caused by "overerase" in stacked gate cells is not possible, because the split gate provides an integral select gate to isolate each memory cell from the bit line.

The cell programs use high efficiency source-side channel hot electron injection. The conditions for programming are in Table 1, reference FIG. 6 for identification of terminals. The intrinsic (i.e. UV erased ) floating gate threshold is positive; thus, the memory cell is essentially non-conducting, with the word line at the reference voltage during a read cycle.

During programming a voltage, approximately equaling the threshold $V_T$ of the select transistor is placed on the control gate, via the word line. This is sufficient to turn on the channel under the select portion of the control gate. The drain is at≅Vss, if the cell is to be programmed. If the drain is at Vdd programming is inhibited. The drain voltage is transferred across the select channel because of the voltage on the control gate. The source is at≅12 volts. The source to drain voltage differential (i.e. 12 volts—≅Vss) generates channel hot electrons. The source voltage is capacitively coupled to the floating gate. The field between the floating gate and the channel very efficiently (=80%) sweeps to the floating gate those channel hot electrons that cross the Si—$SIO_2$ banier height of≅3.2 eV.

The programming effect is eventually self-limiting as negative charge accumulates on the floating gate. The programming source-drain current is very low; thus, the source voltage can be generated by a charge pump internal to the die. The program time is fast because of the high efficiency of source side injection. The addition of negative charge to the floating gate neutralizes the positive charge generated during erasing; thus, the cell is non-conducting when the reference voltage is applied during a read cycle.

Programming can either be by fixed program pulses generated by an internal timer or generated by an external controller to optimize program conditions.

The memory cells are arranged in a true cross point array, using a word line and bit line for address location selection; thus, unselected cells within a page will see the programming voltages. There are two types of possible program disturbs with the field enhanced tunneling injection cell, both of which are described in the following paragraphs. Both mechanisms are preventable by proper design and processing. Defects are screenable with testing. Devices with this memory architecture do not have program disturb caused by accumulated erase/programming cycles because each page is individually isolated. Each cell is only exposed to high voltage within the selected page along the row or source line, there is no high voltage on the bit line.

Reverse tunnel disturb can occur for unselected erased cells within the page sharing a common source line, but on the other row of the selected page to be programmed thus, the word line is grounded. The source voltage is capacitively coupled to the floating gate of the unselected erased cell. If there is a defect in the oxide between the control gate and the floating gate, Fowler-Nordheim tunneling may occur. This could program the unselected erased cell. Proper design and processing assures the reverse tunnel voltage is significantly higher than any applied voltage. Defects are eliminated by including a reverse tunnel voltage screen in the 80% testing operations. Forward tunneling is defined as occurring when electrons are transferred from poly 1 (the floating gate) to poly 2 (the control gate), thereby erasing the cell. Reverse tunneling is defined as occurring when electrons are transferred from poly 2 to poly 1, thereby programming the cell.

Within a page, punch through disturb can occur for erased cells in the adjacent inhibited word line, that share a common source line and bit line with the cell being programmed. An inhibited word line is grounded to prevent normal channel hot electron injection. If there is a defect that reduces channel length and creates punch through along the select gate channel, there could be hot electrons available to program the inhibited erased cell. Proper design and processing assures the punch through voltage is significantly higher than any applied voltage. Defects are eliminated by including a punch through voltage screen in the 80% testing operation.

All oxides are subject to time dependent dielectric breakdown (TBBD), i.e., for a given oxide and electric field, eventually the oxide will breakdown. The lower the electric field and the less time the field is applied, the longer the time to breakdown. For oxides used in normal TTL voltage circuits, this time is essentially infinite; however, in flash memories that use high voltages, the time of oxide exposure to high electric fields can contribute to the intrinsic device reliability.

SST memory cell uses an≅4 MV/cm electric field during erasing. This value is significantly lower than the≅10 MV/cm used by stacked gate flash approaches or the≅11 MV/cm used by the thin oxide $E^2PROM$ and NAND flash approaches. Since the oxide time dependent breakdown ratio is an exponential function of the field strength, the SST memory cell intrinsically has a much lower failure rate than stacked gate cell for oxide breakdown. Note, the SST cal is exposed to the lower electric field for significantly less time during erase, compared with stacked gate approaches.

All memory arrays contain metal to silicon contacts, typically from the metal bit line to the diffused drain of the memory cell. Stacked gate and the SST memory cells use a standard cross-point array, whereby a contact is shred by every two memory cells; thus, there are many contacts in a large memory array, e.g., a 4 Megabit chip contains over 2,000,000 contacts. Contacts must have a very low failure rate because there are so many of them. Contacts and associated metal lines are subject to failure based on the current density passing through the contact and metal line. The lower the current density, the lower the potential failure rate due to contact damage or electromigration mechanisms.

The source-side channel hot electron injection current used in programming SST cells is significantly lower than the drain-side channel hot electron injection current used in programming stacked gate cells. During programming, SST cells use less than 1 µA of source/drain current: this is much less than the read cell current. In contrast, a stacked gate cell requires 500 to 1,000 µA of source-drain current during programming; which is much higher than the read cell current. The high programming current density in stacked gate cells results in a higher probability of failure due to contact damage or electromigration. Since the programming current for the SST cell is much lower than the road current, there is no increase in the reliability failure rate due to programming induced current density failure mechanisms.

Fowler-Nordheim tunneling used for erase is intrinsically a low current operation. Therefore, both the SST and stacked gate cells are not measurably affected by current density during the erase operation.

The field enhancing tunneling injector cell uses relatively thick oxides, compared with other E²PROM or flash EEPROM cells; therefore, intrinsic data retention is robust. The thicker oxides minimize initial and latent oxide defects; thus, improving yield and oxide integrity. The lower voltages used for erase and programming combined with the relatively thicker oxides reduce the endurance related extrinsic data retention failure rate.

Since the field enhancing tunneling injector cell uses a relatively thick oxide for the Fowler-Nordheim tunneling transfer oxide, the primary endurance limitation is due to charge trapping in the interpoly oxide. Since both erasing by tunneling and the source-side channel hot electron programming utilize relatively weaker electric fields across the poly 1 insulating oxides, the oxide rupture failure rate is low.

Trapping occurs mainly in an ≅20 Angstrom shallow region adjacent to the tunneling injector. Within this distance, direct tunneling de-trapping occurs in the quiescent times between erase/program cycles. In practice, this means the endurance of the device in real world applications will be greater than the endurance demonstrated in a test environment, where the device is being erase/program cycled at the maximum possible frequency.

A major concern of reprogrammable nonvolatile memories is that of "disturb" phenomena, i.e., where a different location than the one being erased or programmed is altered. "Disturbs" can occur whenever a high voltage is applied to the gate, source, or drain of a memory cell that is not being intentionally erased or programmed. The SST cell has several design advantages to reduce the possibilities for a disturb:

a). There is no high voltage placed on the bit line, as is common for stacked gate approaches. In addition, the split gate cell isolates each memory storage node from all other nodes along the bit line. Thus, a disturb via the bit line (connected to the drain) is not possible.

b) The device uses a page erase, whereby, all bytes in the page are erased simultaneously, i.e., see the same high voltage at the same time. Since each page is isolated from every other page by the word line selection circuitry, disturbs along the word line (connected to the gate) during erasing are not possible.

c) The device uses a unique source line for each page, unlike most stacked gate devices that have the source line common to large sectors or the entire array. This limits exposure to disturb conditions to only the cells within a page during the time that page is being programmed. This greatly reduces the probability of a disturb and eases the detection. i.e., only the page being programmed need be verified alter any programming operation.

The field enhancing tunneling injector cell uses standard CMOS technology in both the periphery and memory array; therefore, the life test results will be comparable to other devices built with the same process technology. As with all floating gate reprogrammable nonvolatile memories, life test results for a given technology will generally be better than other memories, e.g., SRAM's, built with the same technology because of the standard endurance and data retention infant mortality screening.

While the preferred embodiments of the invention have been shown and described, numerous variations and alternative embodiments will occur to those skilled in the art. Accordingly, it is intended that the invention be limited only in terms of the appended claims.

We claim:

1. A single chip embedded microcontroller comprising,
a processor,
a first non-volatile erasable PROM array having a communication link with said processor, said processor capable of reading, erasing and writing information to and from said first non-volatile erasable PROM, wherein said erasing of said first non-volatile erasable PROM array is performed on a plurality of bytes, and where said first non-volatile erasable PROM array is an OTPROM,
a second non-volatile erasable PROM array having a communication link with said processor, said processor capable of reading, erasing and writing information to and from said second non-volatile erasable PROM, wherein said erasing of said second non-volatile erasable PROM array is performed on a single byte,
a high voltage generator having a communication link with said processor, said high voltage generator generating two or more different erase and write voltages,
a switch communicating with said high voltage generator, said switch connects said two or more different erase and write voltages between said first and second non-volatile erasable PROM arrays, and
said first non-volatile erasable PROM array contains an operating system which controls said single chip embedded microcontroller and alternately provides said two or more different erase and write voltages to said first and second non-volatile erasable PROM arrays.

2. The single chip embedded microcontroller of claim 1 where said switch operates such that said two or more different erase and write voltages cannot be applied simultaneously to both of said first and second non-volatile PROM arrays and can only be applied to either of said first and second non-volatile PROM arrays.

3. The single chip embedded microcontroller of claim 1 in which said first and second non-volatile erasable PROM arrays are FLASH arrays.

4. The single chip embedded microcontroller of claim 1 in which said second non-volatile erasable PROM array is an EEPROM.

5. The single chip embedded microcontroller of claim 1 having an interface circuit that receives signals from outside said single chip embedded microcontroller, said interface circuit having a communication link with said processor.

6. The single chip embedded microcontroller of claim 1 having a ROM containing a program to load said first non-volatile erasable PROM array with an operating system, said ROM communicating with said processor.

7. A single chip embedded microcontroller comprising,
a processor,
a first non-volatile erasable PROM array having a communication link with said processor, said processor capable of reading, erasing and writing information to and from said first non-volatile erasable PROM, wherein said erasing of said first non-volatile erasable PROM array is performed on a plurality of bytes, and where said first non-volatile erasable PROM array is an OTPROM,
a second non-volatile erasable PROM array having a communication link with said processor, said processor capable of reading, erasing and writing information to and from said second non-volatile erasable PROM, wherein said erasing of said second non-volatile erasable PROM array is performed on a single byte, a high voltage generator that generates two or more different erase and write voltages and provides said two or more different erase and write voltages to said first and second non-volatile erasable PROM arrays, said high voltage generator having a communication link with said processor, and said first non-volatile erasable PROM array contains an operating system which controls said single ship embedded microcontroller and alternately provides said two or more different erase and write voltages to said first and second non-volatile erasable PROM arrays.

8. The single chip embedded microcontroller of claim 7 where said high voltage generator operates such that said two or more different erase and write voltages cannot be applied simultaneously to both of said first and second non-volatile PROM arrays and can only be applied to either of said first and second non-volatile PROM arrays.

9. The single chip embedded microcontroller of claim 7 in which said first and second non-volatile erasable PROM arrays are FLASH arrays.

10. The single chip embedded microcontroller of claim 7 in which said second non-volatile erasable PROM array is an EEPROM.

11. The single chip embedded microcontroller of claim 7 having a ROM containing a program to load said first non-volatile erasable PROM array with an operating system, said ROM communicating with said processor.

12. A single chip embedded microcontroller comprising,
a processor,
a first non-volatile erasable PROM array having a communication link with said processor, said processor capable of reading, erasing and writing information to and from said first non-volatile erasable PROM, wherein said erasing of said first non-volatile erasable PROM array is performed on a plurality of bytes, and where said first non-volatile erasable PROM array is an OTPROM,
a ROM containing a program to load said first non-volatile erasable PROM array with an operating system, said ROM communicating with said processor,
a second non-volatile erasable PROM array having a communication link with said processor, said processor capable of reading, erasing and writing information to and from said second non-volatile erasable PROM, wherein said erasing of said second non-volatile erasable PROM array is performed on a single byte,
a high voltage generator having a communication link with said processor, said high voltage generator generating two or more different erase and write voltages, and
a switch communicating with said high voltage generator, said switch connects said two or more different erase and write voltages between said first and second non-volatile erasable PROM arrays.

13. A single chip embedded microcontroller comprising,
a processor,
a first non-volatile erasable PROM array having a communication link with said processor, said processor capable of reading, erasing and writing information to and from said first non-volatile erasable PROM, wherein said erasing of said first non-volatile erasable PROM array is performed on a plurality of bytes, and where said first non-volatile erasable PROM array is an OTPROM,
a ROM containing a program to load said first non-volatile erasable PROM array OTPROM-with an operating system, said ROM communicating with said processors
a second non-volatile erasable PROM array having a communication link with said processor, said processor capable of reading, erasing and writing information to and from said second non-volatile erasable PROM, wherein said erasing of said second non-volatile erasable PROM array is performed on a single byte, and
a high voltage generator that generates two or more different erase and write voltages and provides said two or more different erase and write voltages to said first and second non-volatile erasable PROM arrays, said high voltage generator having a communication link with said processor.

* * * * *